United States Patent [19]

Tigreat

[11] 4,110,762
[45] Aug. 29, 1978

[54] DRAWING MACHINES ESPECIALLY FOR INTEGRATED CIRCUIT MASKS

[75] Inventor: Paul Tigreat, Meylan, France

[73] Assignees: Commissariat a l'Energie Atomique, Paris; Societe pour l'Etude et la Fabrication de Circuits Integres Speciaux, Grenoble, both of France

[21] Appl. No.: 803,883

[22] Filed: Jun. 6, 1977

Related U.S. Application Data

[63] Continuation of Ser. No. 572,096, Apr. 28, 1975, abandoned.

[30] Foreign Application Priority Data

May 10, 1974 [FR] France .................. 74 16288

[51] Int. Cl.² .................. G02B 5/23; G03B 41/00; G03B 27/42
[52] U.S. Cl. .................. 354/4; 350/356; 355/53
[58] Field of Search .................. 355/53, 41, 77, 54, 355/67, 71; 350/160 LC; 33/1 M; 354/4

[56] References Cited

U.S. PATENT DOCUMENTS

| | | | |
|---|---|---|---|
| 3,632,205 | 1/1972 | Marcy .................. | 355/53 |
| 3,704,946 | 12/1972 | Brault et al. .................. | 355/53 X |
| 3,722,996 | 3/1973 | Fox .................. | 355/53 |
| 3,722,998 | 3/1973 | Morse .................. | 355/71 |
| 3,797,935 | 3/1974 | Marcy .................. | 355/53 |
| 3,806,230 | 4/1974 | Haas .................. | 350/160 LC |
| 3,824,604 | 7/1974 | Stein .................. | 355/1 X |
| 3,848,247 | 11/1974 | Sherr .................. | 350/160 LC X |
| 3,881,098 | 4/1975 | Rich .................. | 354/4 X |
| 3,897,137 | 7/1975 | Dobbins .................. | 350/160 LC |

OTHER PUBLICATIONS

Electronics Review, 4/17/1967, vol. 40, No. 8, pp. 47 & 48, Boosting IC's.

Primary Examiner—Donald A. Griffin
Attorney, Agent, or Firm—Lane, Aitken, Dunner & Ziems

[57] ABSTRACT

A machine for drawing on a photographic plate and especially for integrated circuit masks comprises an electro-optical imager having an optical axis x-x', means for controlling the optical state of each point which has dimensions corresponding to the smallest detail to be drawn on the plate, the entire light beam issuing from the imager being applied to an objective which provides a magnification $n$ and has an axis corresponding to the optic axis. Means for producing the relative displacement of the imager and of the photosensitive plate in a plane at right angles to the optic axis and in two orthogonal directions are controlled as a function of indications supplied by means for measuring the relative displacement.

7 Claims, 4 Drawing Figures

DRAWING MACHINES ESPECIALLY FOR INTEGRATED CIRCUIT MASKS

This is a continuation of application Ser. No. 572,096 filed Apr. 28, 1975 and now abandoned.

This invention relates to a drawing machine, especially for integrated circuit masks.

It is known that the various devices produced in the field of microelectronics are fabricated collectively by alternating physico-chemical operations (diffusion, vacuum deposition, etching and so forth) and exposure of photosensitive resin to light through a mask. These operations are known as collective since the substrates on which it is intended to form the various devices are usually segments of silicon whose diameter permits the fabrication of several tens or several hundreds of devices placed side by side in lines and columns of a matrix.

The large number of unitary devices in the form of silicon segments makes it possible to reduce the fabrication cost of such devices, always provided of course that the masks employed for the operations involving exposure of the photosensitive resin permit good efficiency of technological operations. A diffusion operation employed in the construction of the different devices will be considered by way of example. It is known that a layer of silica obtained by thermal oxidation, for example, is to be formed on the surface of the silicon segment. In order to carry out the diffusion of a doping agent within certain regions of the silicon segment, it will be necessary to remove the silica which covers said regions. A photographic mask is accordingly made for this purpose and the zones of the photographic plate corrsponding to the intended diffusion locations are blackened in said mask. The entire silica layer is covered with a photosensitive resin; the photographic mask is applied on said layer and subjected to a high level of illumination. The light passes through the transparent zones of the mask in order to polymerize the resin. Etching with hydrofluoric acid opens windows in the silica at the points at which the resin has been dissolved. The action of a gas containing doping agents of the desired type on the silicon disc which is heated to a high temperature makes it possible to create the zones of the desired type in those portions which are not covered with silica.

The machine in accordance with the invention is precisely intended to form the photographic mask.

It is known that the complexity of circuits increases in two different ways; in the first place, the total dimensions of the silicon wafer becomes larger (at the present time, for example, the silicon wafer can have dimensions of the order of 5 mm × 5 mm); in the second place, the dimensions of each circuit element such as the transistor on the contrary become smaller (of the order of 5 $\mu$). It is therefore apparent that one of the main difficulties involved in forming the photographic mask lies in the fact that there is a very high ratio between the total size of the photographic mask to be formed and the size of the details to be drawn.

A large number of machines for forming masks of this type already exist and can be divided into two main classes. On the one hand, the machines for large-scale drawing in which the drawing obtained on the photographic plate is to a scale of 1:100, 1:200 and 1:500 with respect to the drawings to be made on the silicon disc.

On the other hand, the small-scale drawing machines give a scale of the order of 1:10 to 1:35.

Among the machines of the first class can be mentioned Gerber machines. It can readily be seen that, if the machine produces a drawing to a scale of 1:500 and if the size of the silicon wafer is 5 mm × 5 mm, the dimensions of the photographic mask are 2.50 m × 2.50 m. Moreover, a detail of two microns will have a size of 1 mm. In point of fact, in the case of the operation which consists of reduction by means of a mask of this type, it is very difficult to produce an object-lens which makes it possible to have a sufficient field, sufficiently high resolution and sufficiently high contrast. Moreover, the dimensional stability of the photographic plate decreases in proportion to the increase in area of the film. Finally, the rate of performance is fairly low by reason of the considerable lengths to be covered in order to produce the complete photograph.

In the second class of machines can be mentioned the sweeping machine of the Bell type. This machine permits the formation of the photographic mask by exposure of a photographic plate to light, this being carried out by sweeping of a television type with a laser beam. This sweeping action lasts approximately twenty minutes. It is only slightly dependent on the complexity of the drawing in the case of low degrees of complexity. The laser spot on the photographic plate has a diameter of 7 microns; after a reduction to 1/35th, this produces in the circuit a resolution of 0.2 micron, thus permitting correct drawing of details of 1 micron or more.

This machine is subject in particular to the disadvantage of being unsuited to the construction of masks in blocks, that is, to masks in which the same pattern is reproduced a large number of times.

Moreover, this machine calls for a highly developed electronic control system.

A second machine of this type is the David Mann. This machine comprises on the one hand a table which is capable of moving in two perpendicular directions and on which the photographic plate is fixed and on the other hand a rotating rectangular opening having variable dimensions which is interposed between the light source and said table. Each rectangle of the photograph is obtained by adjusting the rectangular opening and bringing the rectangle of the photographic plate to be installed opposite to said opening.

The disadvantages of this type of machine lie in the fact that the rectangles undergo a unitary treatment. This calls for a very large number of displacements of the moving table. Moreover, the complexity of the circuits (for example integrated circuits of the K.S.I. type (Kolossal Scale Integration) will result in times of the order of one hundred hours when fabricating said circuits with machines of this type. Furthermore, this complexity is not suited to drawings in blocks.

This invention is precisely directed to a machine for drawing integrated circuit masks which overcomes the disadvantages mentioned in the foregoing insofar as it permits the execution of the drawing to a small scale and at high speed while permitting the formation of said photograph in blocks.

The machine for drawing on a photographic plate which is particularly well-suited to the fabrication of masks for integrated circuits essentially comprises:

an electro-optical imager having an optic axis $x'$-$x'$ and provided with means for controlling the optical state of each point of the imager having dimensions which correspond to the smallest drawing detail to be formed on said plate, an object-lens providing a magnification $n$ and having the axis $x-x'$, said lens being capable of receiving the entire light beam which passes out of said imager, means for displacing said imager and said photosensitive plate with respect to each other in a plane at right angles to the axis $x'-x'$ and in the two orthogonal directions X and Y, means for measuring the relative displacement of said imager and of said photosensitive plate along said directions, means for controlling the means which produce the relative displacement of said imager and of said photosensitive plate as a function of the indication of said means for measuring the relative displacement of said imager and of the photosensitive plate.

Said imager can be a light emitter. However, the imager preferably operates as a selective screen and is accordingly illuminated by a lighting system whose axis coincides with the optic axis $x'-x'$.

In this case said drawing machine preferably comprises in addition a shutter which is placed between said lighting system and said imager, and means for controlling the opening of said shutter. In an alternative embodiment of the invention, said imager also carries out the shutting-off function.

The electro-optical imager is preferably of the liquid-crystal type, the points of the imager being disposed in lines and columns and each point of said imager being a square of side P; the means for measuring the displacement of the photographic plate are of the laser-beam interferometry type; finally, said relative displacement means comprise means for displacing the imager and means for displacing the photographic plate.

In accordance with another characteristic feature, the means for displacing the photographic plate consist of a table which is capable of moving in two orthogonal directions X and Y under the action of two screw-and-nut systems each driven by a stepping motor; and the means for displacing the electro-optical imager consist of a table which is capable of moving in two orthogonal directions X and Y under the action of two screw-and-nut systems each driven by a stepping motor.

In a preferred mode of execution, the means for controlling the motors of the imager comprise the means for comparing the displacements of the imager in both directions as measured by said measuring means with pre-indicated displacements, means for producing signals which are representative of the differences $\epsilon_X$ and $\epsilon_Y$ between the measured displacements of the plates and the pre-indicated displacements, said signals being intended to determine the displacement which each motor is intended to impart to the imager support.

In accordance with an alternative embodiment, the imager comprises $q + r$ lines corresponding to the direction X and $q + r$ columns corresponding to the direction Y, only those points of a matrix constituted by $q$ adjacent lines and $q$ adjacent columns being employed at the same time.

In this case, the machine comprises means for comparing the quantities $1/n.\ \epsilon_X$ and $1/n.\ \epsilon_Y$ with two whole-number multiples of the pitch of the imager $k_x p$ and $k_y p$ respectively, means for displacing the matrix of utilized points of the imager by said whole number of pitch $k_x$ in the direction X, means for displacing the matrix of utilized points of the imager by said whole number $k_y$ of pitch in the direction Y, means for producing signals which are representative of the quantities $1//n.\ \epsilon_X - k_x p$ and $1/n.\ \epsilon_Y - k_y p$, said signals being intended to determine the displacement which each motor is intended to impart to the imager support.

A clearer understanding of the invention will in any case be obtained from the following description of one embodiment of the invention which is given by way of example without any limitation being implied, reference being made to the accompanying drawings, wherein.

Figure 1:
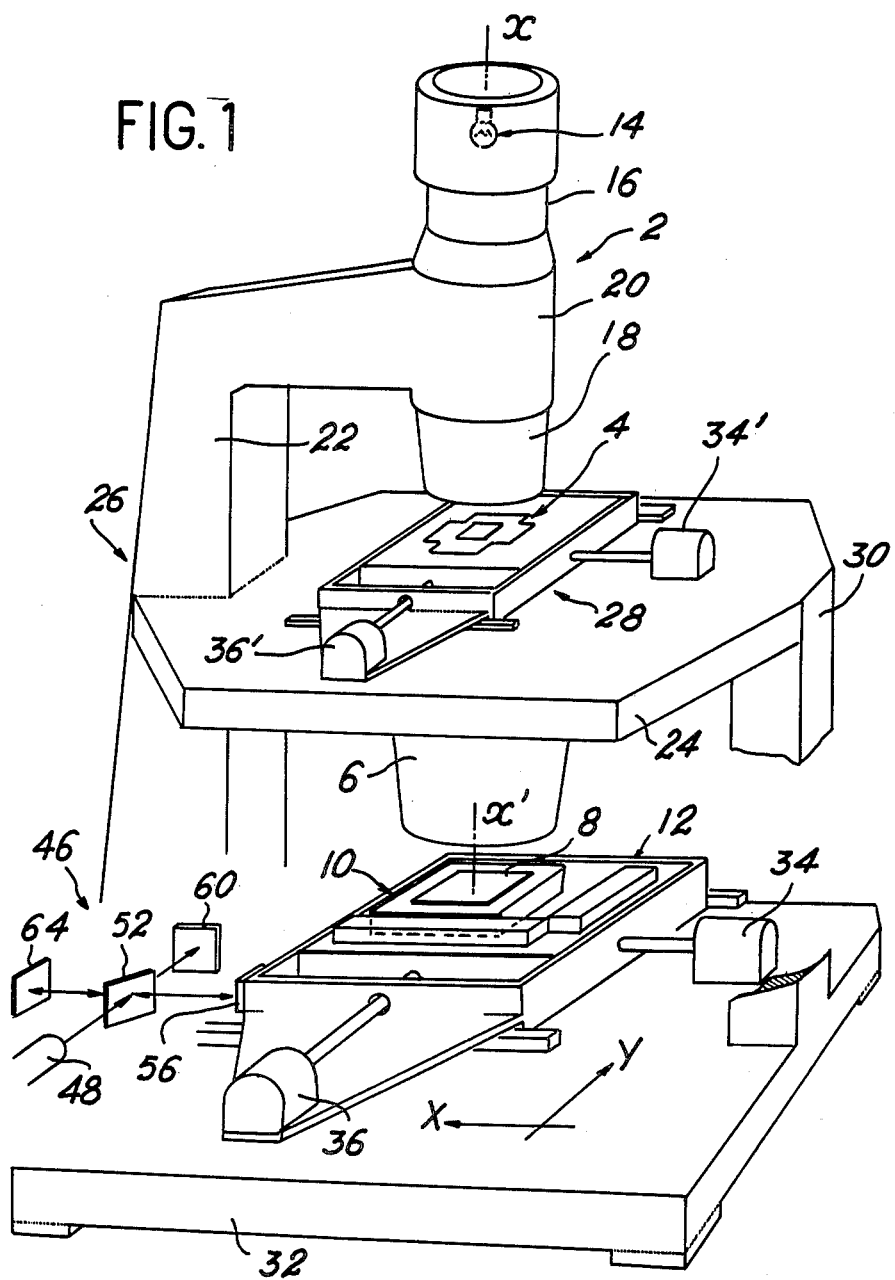
FIG. 1 is a general view in perspective of the drawing machine.

The machine essentially comprises a lighting system 2 for subjecting an electro-optical imager 4 to a light beam. The light beam which passes out of the imager 4 is reduced within the objective 6 which illuminates a photographic plate 8, said plate being fixed on a plate-holder 10 and this latter being rigidly fixed to a table 12 which is capable of moving in two orthogonal directions X and Y.

Before describing the different parts of the drawing machine in greater detail, a concrete example will first be given to show the manner in which the characteristics of the machine can be defined by means of the size of the silicon wafer on which it is desired to implant the integrated circuit and by means of the accuracy which it is desired to obtain in the definition of shapes. It will be assumed that an integrated circuit is to be formed on a 5mm × 5mm silicon wafer or chip and that, in order to define the different parts of the circuit to be formed on said silicon wafer, it is necessary to define a lattice of said wafer in which the lines and the columans have a width of one micron. The photograph constituting the mask which is intended to form the integrated circuit or at least one of these stages is for example on a scale of 1:5 with respect to the real dimensions of the circuit to be formed. In other words, the dimensions of the mask must be 25mm × 25mm with a lattice pitch of 5 microns in width. There is thus defined a square matrix of 5000 lines and 5000 columns. In order to form the mask hereinabove defined, the table will not be displaced in front of a new opening in order to illuminate the different parts of the mask to be blackened since this is a very long operation as has already been shown. An electro-optical imager 4 will be employed for this purpose.

An electro-optical imager is constituted by a matrix of sensitive points or elementary squares in juxtaposed relation and placed in lines and columns. By means of an electric control device associated with each line and with each column, it is possible to control the optical characteristic of each sensitive point of the imager. In other words, by means of this electric control system, one point of the imager can be made either opaque or transparent. It will be assumed that the imager is constituted by a matrix of 500 lines and 500 columns having a width of 50 microns or in other words that each elementary square of the imager is of side 50 microns. Each elementary square of the imager in fact corresponds to each elementary square of the photograph to be produced, the squares of which are of side 5 microns. There is therefore interposed between the imager and the plate an objective 6 which produces a reduction of the image of 1/10.

Since the imager has 500 lines and 500 columns, said imager makes it possible to define a square of 500 × 500 elementary squares of the photograph. In order to define the photograph as a whole, it is therefore necessary to displace the imager with respect to the photograph or to displace the photograph with respect to the imager ten times in the direction of the width and ten times in the direction of the length. There is thus obtained complete coverage of the photographic plate on which an image is to be produced.

The design principle of the machine for drawing integrated circuit masks in accordance with the invention having thus been briefly explained in the foregoing, one particular form of construction of this machine will now be described in greater detail.

The lighting system 2 comprises essentially and in known manner a mercury-vapor lamp 14, two condensers 16 and 18 and a shutter 20. These different elements are secured together in aligned relation and supported by the arm 22 which is rigidly fixed to the upper mounting-plate 24 of the frame 26 of the drawing machine.

The lamp 14 is preferably a mercury vapor lamp of 100 Watts which is commercially available under the trade name OSRAM, type HBO. The luminous flux of said lamp is regulated by its supply.

The shutter 20 is essentially constituted in known manner by a V-shaped pallet which moves in front of the light beam emitted by the lamp 14. The pallet is controlled by a stepping motor. For each picture-taking operation, its rotor is displaced by one-quarter of a revolution so as to allow the light beam to pass through and is then returned to its initial position when the photograph has been taken. The time of exposure is variable and determined by the time of remanence of an elementary drawing on the imager and by the power of the lamp 14. The condensers 16 and 18 are also of known type such as those which are available commercially under the trade name Cerco.

Figure 2:
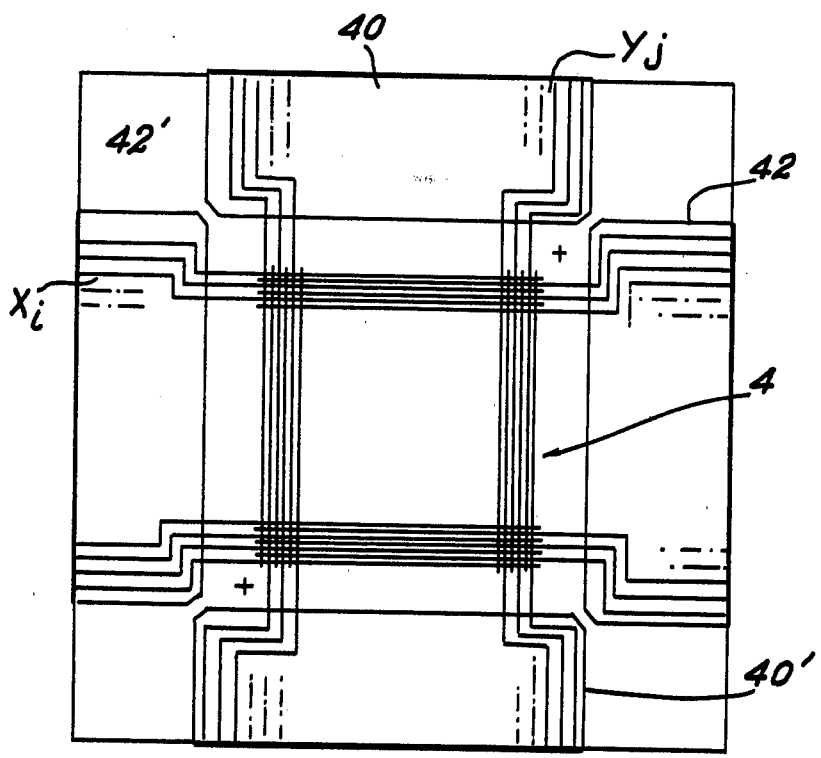
FIG. 2 is a view which shows diagrammatically an electro-optical liquid-crystal imager.

The imager 4 is fixed on a mechanical support 28 which serves to displace said imager 4 in a horizontal plane parallel to the mounting-plate 24 in two orthogonal directions, respectively parallel and at right angles to the plane of FIG. 2. In its initial position, the center of the imager 4 coincides with the optic axis $x'-x'$ of the lighting system 2.

The upper mounting-plate 24 is fixed on two legs such as the leg 30 on which is fixed a lower horizontal mounting-plate 32 which supports the moving table 12. The moving table 12 is capable of displacement in two orthogonal directions X and Y which are parallel to the directions of displacement of the support 28. The table is capable of moving under the action of two electric motors 34 and 36 which each actuate a screw and nut system. A support 10 is fixed on the table 12 and a photographic plate 8 is placed on said support. Similarly, motors 34' and 36' serve to displace the support 28 in the directions X and Y.

The table aforementioned can advantageously be of the type known by the trade name of Schneeberger having external dimensions of 500 × 500 mm. The useful travel at X and at Y is 150 mm. The motors are of the type known by the trade name of Superior Electric Slow Syn. The length of displacement of the table is 5 or 10 microns. The linearity of displacement of the table in both directions is of the order of 10 microns. Finally the machine comprises an objective 6 fixed on the bottom face of the mounting-plate 24 and having an axis which coincides with the axis of the lighting system 2.

The portion of the mounting-plate 24 which separates the imager 4 from the objective 6 is hollowed-out. The objective 6 is advantageously of the make known as Cerco. By way of example, said objective has a magnification of 1/10, a resolution of 2500 lines per mm, a field of 3.6 mm and a depth of field of 2 $\mu$m. The machine can also be equipped with a plurality of objectives having respective magnifications of 1/10, 1/20, 1/50 mounted on rotary drums or on slides.

The electro-optical imager is preferably of the liquid-crystal type. A detailed description of an imager of this type will be found in German patent Application No. 23 46 974.1 filed on Sept. 18th, 1973 in the name of the present Applicant.

The imager 4 is constituted by two transparent plates between which is interposed a film of liquid crystals. Two systems of orthogonal electrodes constituted by parallel semitransparent conductive strips are placed on each plate, the intersection of two strips being such as to determine a point of the imager. By applying an adequate electric signal to the line and the corresponding column at a point of the imager, said point can be made transparent.

An imager 4 designed for practical operation is shown diagrammatically in FIG. 2. This imager comprises 512 lines $X_i$ and 512 columns $Y_j$. The imager is surrounded by four connectors, the connectors 40 and 40' being intended to supply the columns and the connectors 42 and 42' being intended to supply the lines. Each connector therefore has 256 terminals $X_i$ in the case of the connectors 42 and 42' and $Y_j$ in the case of the connectors 40 and 40'. Each point of the imager is a square of 50 × 50 $\mu$m. The imager comprises a useful square matrix of 500 lines × 500 columns. The twelve lines and additional columns make it possible to displace the position of the 500 × 500 useful matrix with respect to the imager itself. The reason for this will become apparent hereinafter.

Figure 3:
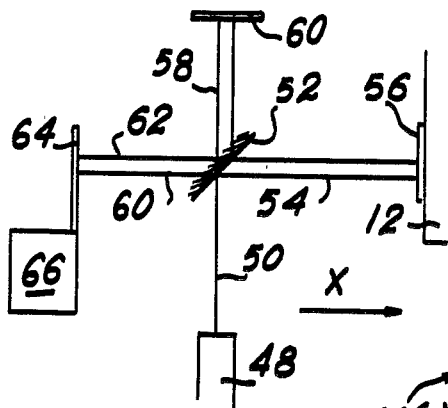
FIG. 3 is a diagram showing the lattice of the photographic plate.

The imager makes it possible to define in a single operation the elementary squares of the mask to be formed which form a part of a square of 500 lines × 500 columns. The complete mask is represented in FIG. 3 by the square 44. As indicated earlier, the complete mask comprises 5000 lines and 5000 columns. The surface corresponding to the imager is represented by the squares $C_{i,j}$. There are thus 10 lines and 10 columns of squares $C_{i,j}$. It is therefore apparent that the table 12 need only be displaced 10 times in the two orthogonal directions X and Y in order to obtain complete definition of the mask.

It should nevertheless be pointed out that the degree of precision afforded by the motors 34 and 36 employed for displacing the table 12 is only ± 10 $\mu$ and that this is distinctly insufficient for the formation of the mask. The precise displacement of the table 12 in the directions X and Y is measured by laser-beam interferometry by means of a displacement-measuring assembly 46. These indications are compared with the real displacements which should have been carried out by the table and errors of positioning are corrected by displacing the mechanical support 28 of the imager 4 by suitable amounts.

The motors 34' and 36' of the mechanical support 28 have a step of 5 $\mu$. Assuming that the objective 6 provides a reduction ratio equal to 1/10, it is clearly possible to correct the table-positioning error to 0.5 m at the level of the mask. Since the maximum error in the position of the table is 10 $\mu$, the maximum displacement to be provided is 100 μ at the level of the imager support. This corresponds to 20 steps of the driving motors 34' and 36' of the imager support. If the correction to be made is greater than 50 μ, said correction can be carried out more rapidly. In fact, the useful surface of the imager (500 × 500) need only be displaced by one or a number of lines and/or one or a number of columns as may be required. It is for this reason that an imager having 512 × 512 intervals has been chosen. Since this displacement represents a correction of 50 μ, the residual correction is provided by the motors 34' and 36'.

Figure 4:
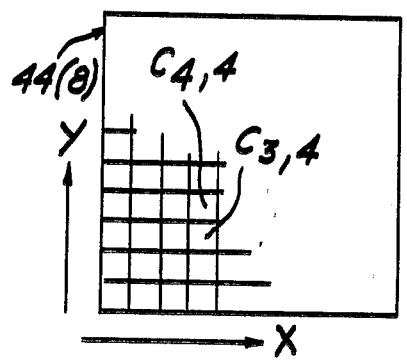
FIG. 4 is a general diagram of the device for controlling the position of the table.

A diagram of construction of the device 46 for controlling the displacement of the table 12 is shown in FIG. 4. By way of example, the device controls the displacements in the direction X. A similar device would be provided for the direction Y. A laser 48 emits a beam 50 which impinges on a semi-reflecting mirror 52 at 45°. One portion of the beam 54 impinges on the mirror 56 which is rigidly fixed to the table 12. The other portion of the beam 58 impinges on a stationary mirror. The reflected beams 60 and 62 are collected on a reading diode 64. The interference fringes in the device 66 are counted, thereby deducing from these latter the displacement of the moving mirror 56 in the direction X.

In an alternative embodiment, the device for controlling the displacement of the table can consist of a single assembly for measuring the displacements in the direction X and in the direction Y at the same time. The laser beam is divided into two beams, one of which is employed for measuring along X and the other for measuring along Y. More detailed explanations in regard to a device of this type will be found in the Hewlett-Packard Catalog, technical note of March, 1974. Use is made of a type 5501 A laser transducer and type 1070 A interferometers. The resolution obtained is 0.08 μm.

A complete cycle of operation of the machine will now be described. It will be assumed that the table is in a position corresponding to the square $C_{3,4}$ and that the following square on which an image is to be produced is the square $C_{4,4}$. Starting from this initial position, the displacement motor 34 is operated in the direction X in order that said motor should perform a number of steps corresponding to a displacement of 2.5 mm. During this operation, the shutter 20 is obviously closed. The device 46 serves to measure the real displacement of the table 12 in the direction X and also in the direction Y. These measurements are compared with the desired displacements and an error signal $\epsilon_X$ for the displacement in the direction X and $\epsilon_Y$ for the displacement in the direction Y. These errors are multiplied by the reciprocal of the magnification of the objective 6 (10 in the example described) in order to restore them to the level of the imager, thus giving the errors $\epsilon'_X$ and $\epsilon'_Y$. If one or both of these errors are greater than 50 μ, an order of displacement of a line or of a column or both depending on the various cases is stored in the display control system of the imager. The motors 34' and 36' are then operated so as to displace the imager 4 in order to correct the residual error or errors. The imager is then perfectly positioned with respect to the photographic plate. The optical state of each point of the imager corresponding to the elementary squares of that portion of the photographic plate which is "covered" by the imager is then controlled. The shutter 20 is opened during the necessary time of exposure. The portion of mask corresponding to the square $C_{4,4}$ is formed.

Two different methods can be adopted for carrying out the displacements of the table 12. One method consists in employing a continuous sweeping or in other words in producing images successively on the 10 squares $C_{i,j}$ of a line, then in passing to the following line; all the squares $C_{1+i,j}$ of said line are then swept and so forth. Another method consists in carrying out non-continuous sweeping in "blocks". This second mode of sweeping is advantageous if a number of squares $C_{i,j}$ are identical. In fact, if these identical squares are covered successively by the imager, it is only necessary to regenerate the optical state of the imager between two illuminating operations. On the other hand, control of the displacements is in that case more complex.

It will be readily understood that, in addition to the main elements described earlier, the machine comprises a certain number of control and programming circuits for making the sequence of operations automatic.

There is first defined a chronological order of formation of the squares $C_{i,j}$. This chronology results in lengths of displacements from one position of the table to the next. These orders are stored in memory, for example in the form of a number of steps of the motors 34 and 36. An optical state of each point of the imager corresponds to each position of the table. It is therefore also necessary to store in memory the voltage levels to be applied to each line and to each column of the imager in respect of each position. This set of data constitutes the program of the machine for the formation of a given mask.

There is also provided an assembly for synchronizing the different operations to be performed: starting-up of the motors 34 and 36; starting-up of the motors 34' and 36'; actuation of the shutter. The construction of an assembly of this type is wholly within the capacity of any one versed in the art and consequently need not be described in greater detail.

In the example described in the foregoing, consideration was given to the formation of a mask of 25 × 25 mm in which each elementary square was of side 5 μm. It is clearly possible to provide other dimensions of masks with the same machine. If the definition of the mask is unchanged and if the overall dimensions of the mask are modified, it is only necessary to define a different number of squares $C_{i,j}$. If the definition of the mask is modified (for example if said definition changes from 5 μ to 1 μ), it is only necessary to modify the magnification ratio of the objective 6 which would be 1/50 in the new case which is contemplated. The degree of precision will then increase from 0.5 μ to 0.1 μ. Postulating the case in which the overall dimensions of the mask are not modified, there would in such a case be 50 lines and 50 columns of squares $C_{i,j}$.

The foregoing description shows that the imager is opaque in the state of rest; it can therefore perform the function of a shutter. However, since the opacity of the liquid crystal is not absolutely perfect, it is preferable in some cases to employ a separate shutter in order to prevent any undesired exposure of the photographic plate.

Moreover, the principle of the invention is compatible with a light-emitting imager such as a matrix of selectively controlled electroluminescent diodes, for example. A design of this type evidently forms part of the present invention.

It is clearly brought out by the foregoing description that the basic design of the drawing machine in accordance with the invention differs to a very appreciable extent from the two main types of known machines, whether these latter are of the laser-beam sweeping type or of the slit type. The difference with respect to the sweeping machine is quite clear and the difference with respect to the slit machine is no less apparent since the table displacements to be carried out are as many in number as the rectangular shapes to be drawn (by means of the slit) when employing a machine of this type.

In addition to the advantages already mentioned, the machine in accordance with the invention makes it possible to obtain a much higher degree of reliability.

If the rectangles were drawn as separate units, an error in the position and/or in the dimensions of one rectangle would be produced in all of the following rectangles. By reason of the large number of said rectangles and the long drawing time, the risk of error due to an internal cause in the machine or an external cause (parasitic disturbance) is appreciable. When the 100 squares $C_{i,j}$ (or more) are reproduced, the number of operations is much smaller and this applies also to the length of time taken, with the result that the risk of error decreases accordingly.

The invention clearly extends to all applications other than the formation of integrated circuit masks, namely which require the construction of drawings on a photographic plate, for example the manufacture of coded rules.

What we claim is:

1. A machine for drawing on a photosensitive plate, comprising:
    an electro-optical imager having an optic axis $x-x'$, the imager including a plurality of fixed image points arranged in a preselected array,
    means for selectively controlling the optical state of each point of the imager at the same time for forming a pattern of a number of points which have an optical state different from the remaining points,
    photosensitive plate means aligned with the optic axis of the imager,
    the dimensions of each point of the imager corresponding to the smallest detail drawing to be formed on the plate,
    means for selectively transmitting a beam of light along the optic axis $x-x'$ when said pattern is formed on the imager,
    an objective located on the side of the imager opposite the means for transmitting for providing a magnification n and having the axis $x-x'$, said objective being capable of receiving the entire light beam which passes out of said imager,
    means for displacing said imager and said photosensitive plate means with respect to each other in a plane at right angles to the axis $x-x'$ and in the two orthogonal directions X and Y,
    means for measuring the relative displacement of said imager and of said photosensitive plate in the directions aforesaid,
    means for controlling the means which produce the relative displacement of said imager and of said photosensitive plate as a function of the indication of said means for measuring the relative displacement of said imager and of the photosensitive plate.

2. A machine according to claim 1, wherein each point of the imager is capable of assuming two optical states, namely a light-emitting state and a non-emitting state.

3. A machine according to claim 1, wherein said imager is capable of assuming two optical states, namely a transparent state and an opaque state.

4. A machine according to claim 3, wherein the electro-optical imager is of the liquid-crystal type, wherein the points of the imager are disposed in lines and columns and wherein each point of said imager is a square of side P.

5. A machine according to claim 1, wherein the means for controlling said motors comprise means for comparing the displacements of the photosensitive plate in both directions as measured by said measuring means with pre-indicated displacements, means for producing signals which are representative of the differences $\epsilon_X$ and $\epsilon_Y$ between the measured displacements and the pre-indicated displacements, said signals being intended to determine the displacement which each motor is intended to impart to the imager support.

6. A machine according to claim 1 wherein said imager comprises $q + r$ lines corresponding to the direction X and $q + r$ columns corresponding to the direction Y, only those points of a matrix constituted by $q$ adjacent lines and $q$ adjacent columns being employed to provide a light beam to the objective at the same time.

7. A machine according to claim 6, wherein said machine comprises means for comparing the quantities $(1/n.)\epsilon_X$ and $(1/n.)\epsilon_Y$ with a whole number of pitches P of the imager $k_x p$ and $k_y p$ respectively, means for displacing the points of the imager of the different optical state by said whole number of pitches $k_x$ in the direction X, means for displacing the matrix of utilized points of the imager by said whole number of pitches $k_y$ in the direction Y, means for producing signals which are representative of the quantities $(1/n)\epsilon_X - k_x p$ and $(1/n)\epsilon_Y - k_y p$, said signals being intended to determine the displacement which each motor is intended to impart to the imager support.

* * * * *